United States Patent [19]

Choquette et al.

[11] Patent Number: 5,275,687
[45] Date of Patent: Jan. 4, 1994

[54] PROCESS FOR REMOVING SURFACE CONTAMINANTS FROM III-V SEMICONDUCTORS

[75] Inventors: Kent D. Choquette, Albuquerque, N. Mex.; Robert S. Freund, Livingston, N.J.; Minghwei Hong, Watchung, N.J.; Joseph P. Mannaerts, Summit, N.J.

[73] Assignee: AT&T Bell Laboratories, Murray Hill, N.J.

[21] Appl. No.: 979,119

[22] Filed: Nov. 20, 1992

[51] Int. Cl.$^5$ ............................................. C30B 23/02
[52] U.S. Cl. ..................... 156/612; 156/626; 437/946; 148/DIG. 17; 134/1
[58] Field of Search ............ 156/612, 626; 148/DIG.; 437/946; 134/1, 2

[56] References Cited

U.S. PATENT DOCUMENTS

| | | | |
|---|---|---|---|
| 4,488,914 | 12/1984 | Quinlan et al. | 156/612 |
| 4,877,757 | 10/1989 | York et al. | 148/DIG. 17 |
| 5,011,705 | 4/1991 | Tanaka | 134/1 |
| 5,015,330 | 5/1991 | Okumura et al. | 134/1 |
| 5,089,441 | 2/1992 | Moslehi | 148/DIG. 17 |
| 5,102,496 | 4/1992 | Savas | 134/1 |
| 5,137,847 | 8/1992 | Shimakura et al. | 437/946 |
| 5,178,721 | 1/1993 | Sugino | 134/1 |

OTHER PUBLICATIONS

G. Laurence, et al. "Combined RHEED-AES Study of the Thermal Treatment of (001) GaAs Surface Prior to MBE Growth" *Appl. Phys.* 19, pp. 63-70 (1979).
R. P. H. Chang, et al. "Hydrogen plasma etching of GaAs oxide" *Appl. Phys. Lett.* 38, pp. 898-900 (1981).
J. A. McClintock, et al. "UV-Ozone Cleaning of GaAs for MBE" *J. Vac. Sci. Technol.*, 20, pp. 241-243, (1982).
A. Y. Cho, "Growth of III-V Semiconductors by Molecular Beam Epitaxy and their Properties" *Thin Solid Films*, 100 pp. 291-317, (1983).
P. Friedel, et al. "Interactions between $H_2$ and $N_2$ plasmas and a GaAs (100) surface: Chemical and electronic properties" *Appl. Phys. Lett.*, 42, pp. 509-511 (1983).
K. Asakawa, et al. "Damage and contamination-free GaAs and AlGaAs etching using a novel ultrahigh-vacuum reactive ion beam etching system with etched surface monitoring and cleaning method" *J. Vac. Sci, Technol.* A 4, pp. 677-680 (1986).
A. Takamori, et al. "Cleaning of MBE GaAs Substrates by Hydrogen Radical Beam Irradiation", *Jap. J. of Appl. Physics*, vol. 26, pp. L142-L144, (1987).
H. Miyamoto, et al. "Damage-and contamination-free in situ chlorine gas etching and regrowth of a GaAs layer with a new ultrahigh vacuum dry etching-MBE system", Inst. Phys. Conf. 96, pp. 47-52 (1989).
S. Sugata, et al. "GaAs cleaning with a hydrogen radical beam gun in an ultrahigh-vacuum system", *J. Vac. Sci. Technol.* B6, pp. 1087-1091, (1988).
N. Kondo, et al. "Low-Temperature Surface Cleaning of GaAs by Electron Cyclotron Resonance (ECR) Plasma", *Jap. J. of Applied Physics*, vol. 28, pp. L7-L9, (1989).

(List continued on next page.)

*Primary Examiner*—Olik Chaudhuri
*Assistant Examiner*—Ramamohan Rao Paladugu
*Attorney, Agent, or Firm*—Glen E. Books

[57] ABSTRACT

In accordance with the invention, a contaminated III-V semiconductor surface is cleaned by the sequential steps of exposure to hydrogen plasma, chemical etching in chlorine and annealing in vacuum. In a preferred embodiment, a semiconductor of the gallium arsenide family is subjected to hydrogen plasma in an ECR system for 20-120 minutes, then, without breaking vacuum, subjected to a $Cl_2$ chemical etch at 250° C.-450° C. for 1-5 minutes. Again, without breaking vacuum, the semiconductor is annealed at 200° C.-600° C. for 5-15 minutes. To obtain good surface reconstruction, annealing preferably takes place at a temperature 300° C. or above. The semiconductor surface thus processed is atomically smooth and sufficiently clean to permit regrowth of a high quality epitaxial layer.

6 Claims, 3 Drawing Sheets

OTHER PUBLICATIONS

I. Suemune, et al. "Incidence angle effect of a hydrogen plasma beam for the cleaning of semiconductor surfaces", *Appl. Phys. Lett.* 55, pp. 760–762, (1989).

S. V. Hattangady, et al. "In situ cleaning of GaAs surfaces using hydrogen dissociated with a remote noble-gas discharge," *J. Appl. Phys.* 68, pp. 1233–1236, (1990).

J. Massies, et al. "In Situ Deoxidation of GaAs Substrates by HCl Gas", *Jap. J. of Applied Physics*, vol. 26, pp. L38–L40, (1987).

K. D. Choquette, et al. "Electron cyclotron resonance plasma preparation of GaAs surface-prepared ultrasonic running de-ionized water treatment" *J. Vac. Sci. Technol.* B9, pp. 3502–3505, (1991).

Y. Hirota, et al. "Reflection high-energy electron diffraction observation of GaAs surface-prepared ultrasonic running de-ionized water treatment", *Appl. Phys. Lett.* 58, pp. 2794–2796, (1991).

E. M. Clausen, et al. "Assessing thermal $Cl_2$ etching and regrowth as methods for surface passivation", *J. Vac. Sci. Technol.* B8, pp. 1960–1964, (1990).

J. P. Contour, et al. "In situ chemical etching of GaAs (001) and InP (001) substrates by gaseous HCl prior to molecular-beam epitaxy growth", *J. Vac. Sci. Technol.* B5, pp. 730–733, (1987).

J. Saito, et al. "Effects of etching with a mixture of HCl gas and $H_2$ on the GaAs surface cleaning in molecular-beam epitaxy", *J. Appl. Phys.* 67, pp. 6274–6280, (1990).

G. M. Mikhailov, et al. "XPS investigation of the interaction between ECR-excited hydrogen and the native oxide of GaAs (100)", *Vacuum* 43, pp. 199–201, (1992).

J. Saito, et al. "GaAs Surface Cleaning with HCl Gas and Hydrogen Mixture for Molecular-Beam-Epitaxial Growth", *Jap. J. of Applied Physics*, vol. 27, pp. L702–L703, (1988).

N. Furuhata, et al. "Chemical dry etching of GaAs and InP by $Cl_2$ using a new ultrahigh-vacuum dry-etching molecular-beam-epitaxy system", *J. Appl. Phys.* vol. 65, pp. 168–171, (1989).

Y. Kadoya, et al. "Formation of High Mobility Two Dimensional Electron Gas at Etch-Regrown AlGaAs/GaAs Interface Prepared by Chlorine Gas Etching and MBE in an UHV Multichamber System", 7th Int'l Conf. on Molecular Beam Epitaxy (1992).

PROCESS FOR REMOVING SURFACE CONTAMINANTS FROM III-V SEMICONDUCTORS

FIELD OF THE INVENTION

This invention relates to processing III-V semiconductors and, in particular, to a process for removing surface contaminants such as C, Si and O, from substrates of the gallium arsenide or indium phosphide families. The process produces a surface which is sufficiently smooth and free of impurities that a high quality epitaxial layer can be grown on a previously contaminated surface.

BACKGROUND OF THE INVENTION

Preparation of contamination-free surfaces of III-V semiconductors is important for many potential electronic and optoelectronic applications. Specifically, cleaning the surface of a grown and processed GaAs or AlGaAs layer for subsequent MBE regrowth is essential for the fabrication of device structures employing lateral heterostructures for current injection, carrier confinement or optical confinement. Aside from native oxides, the major contaminants are carbon, oxygen and silicon. Carbon impurities are particularly troublesome because the presence of carbon is related to carrier depletion at the epilayer-substrate interface. Silicon is a common element and is often found as a surface impurity. Silicon contamination arises, for example, from ion sputtering of quartz liners in ECR plasma sources and from $SiCl_4$ etching gas.

SUMMARY OF THE INVENTION

In accordance with the invention, a contaminated III-V semiconductor surface is cleaned by the sequential steps of exposure to hydrogen plasma, chemical etching in chlorine and annealing in vacuum. In a preferred embodiment, a semiconductor of the gallium arsenide family is subjected to hydrogen plasma in an ECR system for 20-120 minutes, then, without breaking vacuum, subjected to a $Cl_2$ chemical etch at 250° C.-450° C. for 1-5 minutes. Again, without breaking vacuum, the semiconductor is annealed at 200° C.-600° C. for 5-60 minutes. To obtain good surface reconstruction, annealing preferably takes place at a temperature 300° C. or above. The semiconductor surface thus processed is atomically smooth and sufficiently clean to permit regrowth of a high quality epitaxial layer.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
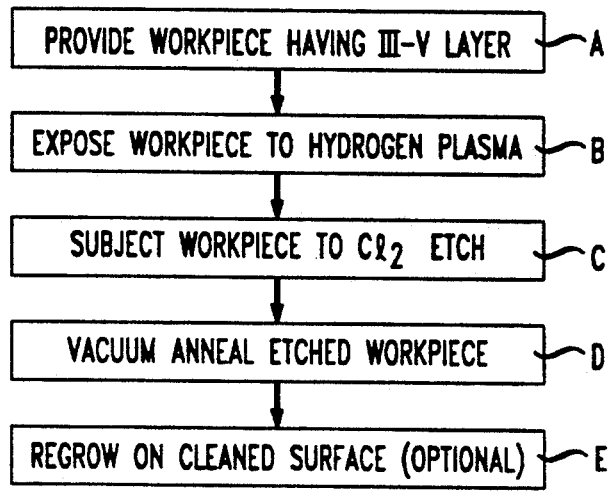
FIG. 1 is a block diagram showing the steps of cleaning a III-V semiconductor workpiece in accordance with the invention.

Referring to the drawings, FIG. 1 illustrates the steps in processing a III-V semiconductor surface in accordance with the invention. As shown in 1A, the first step is to provide a workpiece having a surface layer of III-V semiconductor.

Figure 2:
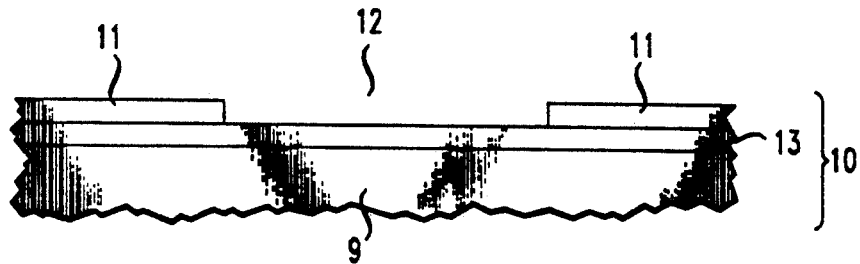
FIG. 2 is a schematic cross section of a typical workpiece to be cleaned.

As shown in FIG. 2 workpiece 10 can include a masking layer 11 of non III-V material, such as silicon oxide, exposing only a predetermined surface area 12 of the semiconductor layer 13. Such a workpiece can be the result of several preceding steps producing a desired stack of different doped semiconductor layers. The prior steps can include exposure to atmospheric contamination. The process is particularly useful for semiconductors in the gallium arsenide or indium phosphide families including gallium arsenide, aluminum gallium arsenide, indium gallium arsenide, aluminum arsenide, aluminum indium arsenide, indium phosphide, aluminum indium phosphide, and indium gallium arsenide phosphide.

The next step shown in 1B is to expose the workpiece to hydrogen plasma. This is preferably accomplished by introducing the workpiece into an ECR plasma chamber evacuated to a base pressure of $5 \times 10^{-9} - 2 \times 10^{-10}$ torr. The workpiece is subjected to hydrogen plasma for a time sufficient to remove oxides from the GaAs surface. Typical processing parameters are $H_2$ flow rates of 10-20 sccm giving pressure of about $1 \times 10^{-4}$ torr, microwave power density of 0.5 watts/cm$^2$ or more and exposure duration of 20-120 min. Preferably the workpiece is oriented at 70° from normal incidence from the ECR source.

The next step shown in 1C is to subject the workpiece to a $Cl_2$ chemical etch. This $Cl_2$ gas etching follows the plasma treatment and is preferably done without exposing the workpiece to atmosphere as by using the same chamber for both $H_2$ plasma treatment and the $Cl_2$ chemical etch or by transferring the workpiece to a separate chemical etch chamber without breaking vacuum. With the workpiece temperature maintained at an elevated temperature, the workpiece is subjected to $Cl_2$ etching for a time sufficient to remove carbon and silicon impurities. Typical process parameters are: workpiece temperature 250°-450° C., $Cl_2$ pressure $10^{-4}$ torr with a flow rate of 1-2 sccm and etching time of 1-5 min. The etching rate using $Cl_2$ at this temperature range is typically 600-1000 Å/min. After etching, the pressure is pumped down to $10^{-7}$ torr before transferring the workpiece to another ultra high vaccum UHV chamber ($2 \times 10^{-9}$ torr).

The next step shown in 1D is to anneal the etched workpiece. This annealing is preferably accomplished without exposing the workpiece to atmosphere by transferring the workpiece to an annealing chamber without breaking vacuum. The chemically etched workpiece is preferably transferred to a UHV transfer module and then to a UHV chamber for annealing. The workpiece is annealed by heating to a temperature of 200° C.-600° C. for a period of 5-60 min. Preferably GaAs is annealed at about 500° C. for 10 min. The heat treatment anneals the surface and removes any residual physisorbed gas, reaction products or weakly bound impurities. Annealing at 300° C. or above reconstructs the surface.

Figure 3:
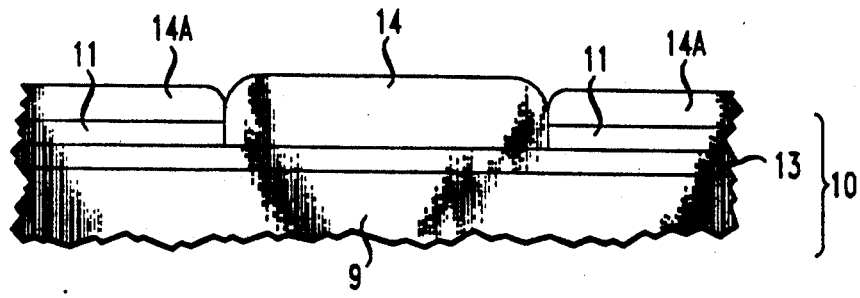
FIG. 3 shows the FIG. 2 workpiece after cleaning and regrowth.

As an optional final step shown in 1E, the workpiece can be transferred under vacuum to a growth chamber for regrowth on the cleaned surface. For example, as shown in FIG. 3, a high quality layer of semiconductor 14 such as GaAs, AlGaAs, AlAs and InGaAs can be epitaxially regrown as by MBE at the well-known growth temperature for each material. (The polycrystalline material grown on the mask is designated 14A).

The advantages of this process have been demonstrated by a number of tests. For example, reflection high energy electron diffraction patterns (RHEED patterns) were taken along the [110] and [1$\bar{1}$0] directions of a GaAs workpiece after the annealing step. The patterns show strong contrast between the RHEED streaks and the background, along with Kikuchi arcs. $4 \times 2$ or $4 \times 6$ RHEED patterns are obtained, indicating that the surface has a high degree of reconstruction and is atomically smooth and ordered, having a surface quality comparable to a freshly grown GaAs surface.

Figure 4:
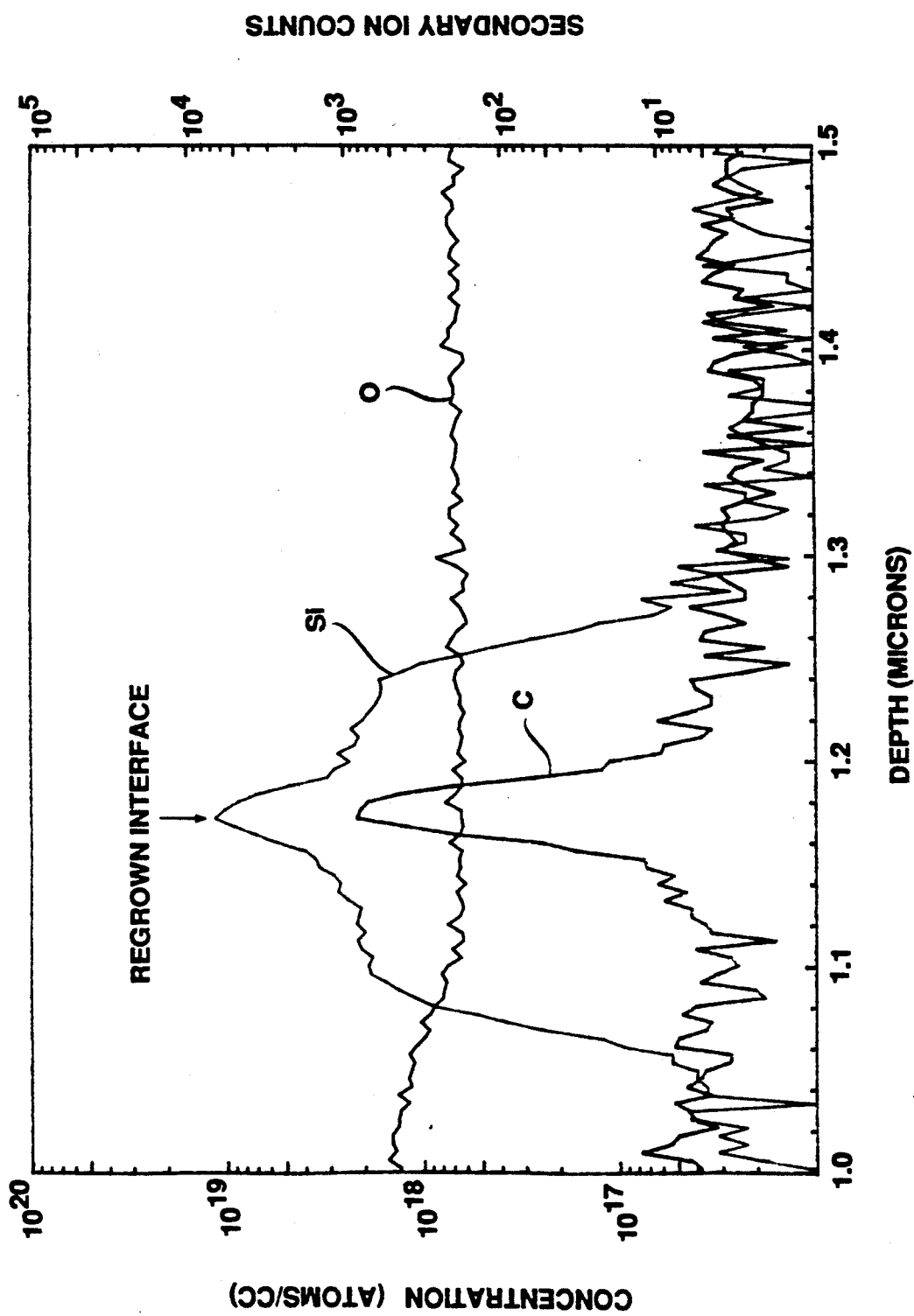
FIGS. 4 and 5 are SIMS curves for workpieces processed in two different ways.
Figure 5:
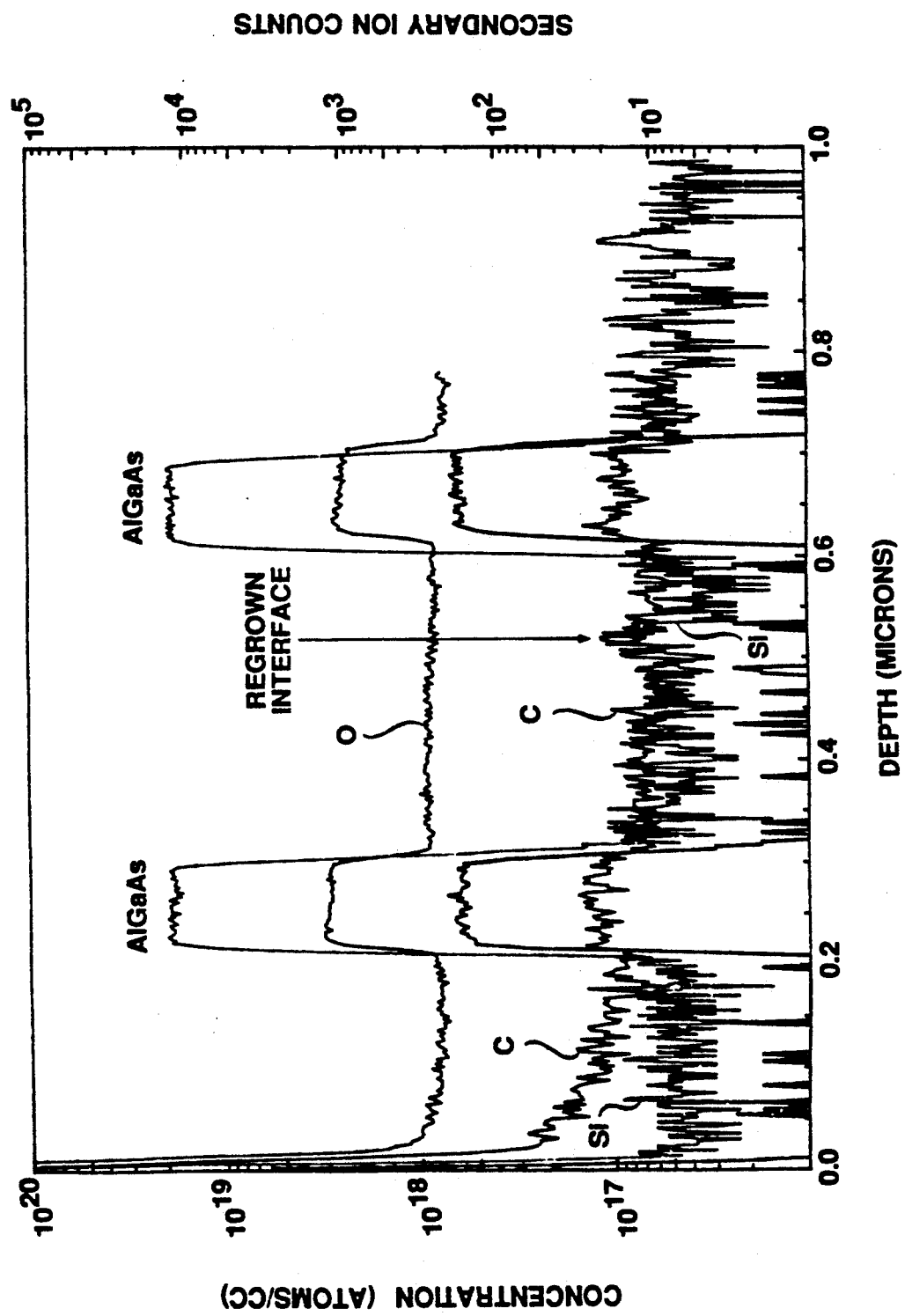

FIGS. 4 and 5 are secondary ion mass spectroscopy (SIMS) curves using a 3 KeV cesium ion sputtering beam on surfaces processed in two ways. Calibration standards were used to determine the concentration of various elements, and $Al_{0.1}Ga_{0.9}As$ layers were grown in the samples to act as depth markers. FIG. 4 shows the surface contamination of a workpiece after $H_2$ plasma cleaning and a 500° C. annealing, but without $Cl_2$ etching. Oxygen was not detectable above the background of the analysis chamber of the SIMS measurement ($<10^{12} cm^{-2}$). Carbon impurity was observed to have an areal density of about $4 \times 10^{12} cm^{-2}$, and silicon impurity was at $5 \times 10^{13} cm^{-2}$.

FIG. 5 shows typical SIMS curves for a workpiece cleaned and annealed in accordance with the FIG. 1 process. Oxygen was not detectable above background and the areal densities for C and Si were reduced to less than $10^{11} cm^{-2}$ these curves show that the surface is substantially free of C, Si and O impurities.

It is to be understood that the above-described embodiments are illustrative of only a few of the many possible specific embodiments which can represent applications of the inventive process. Numerous and varied other embodiments can be devised by those skilled in the art without departing from the spirit and scope of the invention.

We claim:

1. A method for reducing surface contamination of III-V semiconductors comprising the steps of:
   providing a workpiece including a III-V semiconductor surface;
   exposing said workpiece to hydrogen plasma;
   after exposure to hydrogen plasma and without breaking vacuum, etching said workpiece at a temperature in the range of 250° C.-450° C. in chlorine for 1-5 minutes;
   after etching in chlorine and without breaking vacuum, annealing said workpiece to produce an atomically smooth and clean surface substantially free of C, Si and O impurities.

2. The method of claim 1 wherein said workpiece is exposed to hydrogen plasma in an ECR plasma generator for a period 20-120 minutes.

3. The method of claim 1 wherein said workpiece is annealed at a temperature in the range 200° C. -600° C. for a period 5-60 minutes.

4. The method of claim 1 wherein said workpiece comprises a III-V semiconductor surface of the gallium arsenide or indium phosphide families.

5. The method of claim 1 further comprising the step after annealing and without breaking vacuum, of epitaxially growing a layer of III-V semiconductor on the semiconductor surface.

6. A method for growing an epitaxial layer on a previously contaminated surface of semiconductor of the gallium arsenide or indium phosphide families comprising the steps of:
   exposing said surface to hydrogen plasma for a period of 20-120 minutes;
   after said exposure to hydrogen plasma and without breaking vacuum, etching said surface at temperature in the range 250 ° C.-450° C. in $Cl_2$ for 1-5 minutes;
   after etching and without breaking vacuum, annealing said surface at a temperature in the range 200° C.-600° C. for 5-60 minutes; and
   after annealing and without breaking vacuum, epitaxially growing a layer of semiconductor of the gallium arsenide or indium phosphide families on said surface.

* * * * *